United States Patent [19]

Sims et al.

[11] Patent Number: 5,286,318
[45] Date of Patent: Feb. 15, 1994

[54] METHOD OF FORMING EMI SHIELDED ENCLOSURES, EMI SHIELDED ENCLOSURES AND EMI SHIELDS

[75] Inventors: Richard E. Sims, Arlington Heights; William E. Curran, Medinah; Stefan J. Hipskind, Roselle, all of Ill.

[73] Assignee: The Curran Company, Glendale Heights, Ill.

[21] Appl. No.: 804,489

[22] Filed: Dec. 9, 1991

Related U.S. Application Data

[63] Continuation of Ser. No. 504,007, Apr. 4, 1990, abandoned.

[51] Int. Cl.$^5$ .......................... E04F 15/00; H05K 9/00
[52] U.S. Cl. ........................... 156/71; 52/79.1; 174/35 MS
[58] Field of Search .............. 174/35 MS File, 35 R, 174/32; 156/71, 297, 299; 52/79.1, 263, 171

[56] References Cited

U.S. PATENT DOCUMENTS

| | | | |
|---|---|---|---|
| 4,174,419 | 11/1979 | Nienart | 156/60 X |
| 4,239,795 | 12/1980 | Haage et al. | 156/278 |
| 4,578,310 | 3/1986 | Hatfield | 174/35 MS X |
| 4,597,817 | 7/1986 | Larsen | 52/746 |
| 4,651,099 | 3/1987 | Vinegar et al. | 174/35 MS |
| 4,692,373 | 9/1987 | Welz et al. | 428/425.8 X |
| 4,714,623 | 12/1987 | Riccio et al. | 427/423 X |
| 4,749,625 | 6/1989 | Obayashi et al. | 174/35 MS X |
| 4,863,789 | 9/1989 | Arai | 174/35 MS |
| 4,882,216 | 11/1989 | Takimoto et al. | 428/418 X |
| 4,890,083 | 12/1989 | Trenkler et al. | 335/301 |
| 4,950,423 | 8/1990 | Sullivan | 252/512 |
| 4,965,408 | 10/1990 | Chapman et al. | 174/35 MS |
| 4,980,223 | 12/1990 | Nakano et al. | 174/35 MS |

*Primary Examiner*—Jeff H. Aftergut
*Assistant Examiner*—Robert W. Robey
*Attorney, Agent, or Firm*—Mason, Kolehmainen, Rathburn & Wyss

[57] ABSTRACT

A method of forming EMI shielded enclosures, an EMI shielded enclosure and EMI shield are provided. A sealer composition is applied onto a surface and is allowed to substantially dry cure into a uniform, seamless layer. An adhesive composition is applied to the dried sealer composition. Then, an electrically-conductive material, such as metallic sheet, such as copper sheeting, is attached to the dried sealer composition by the adhesive composition. Alternatively, a bonded sheet of dielectric material is applied to the adhesive composition. Then the metallic sheet is attached to the bonded sheet of dielectric material by an adhesive composition second layer.

11 Claims, 1 Drawing Sheet

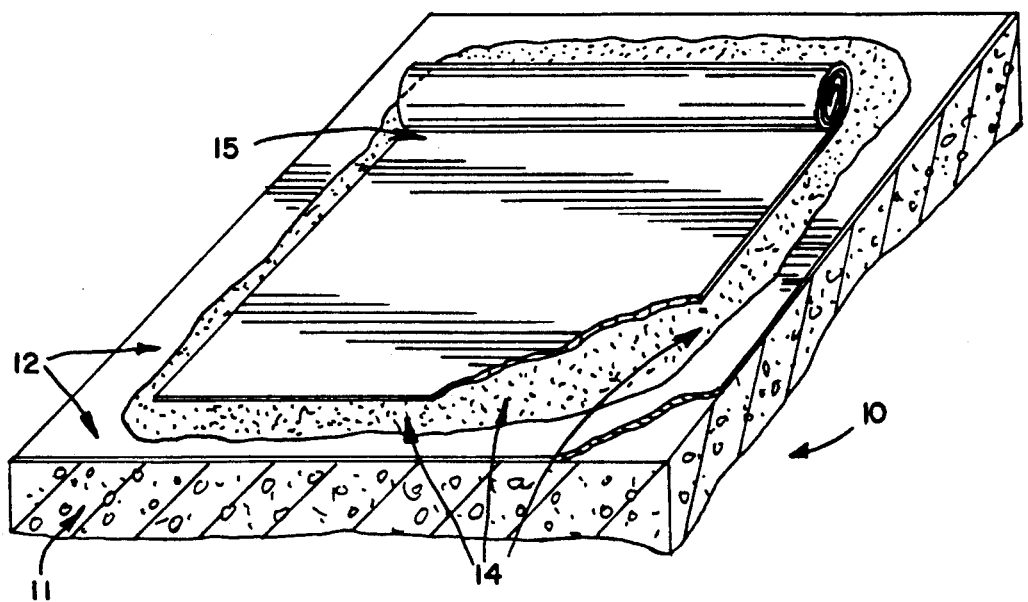
FIG_1
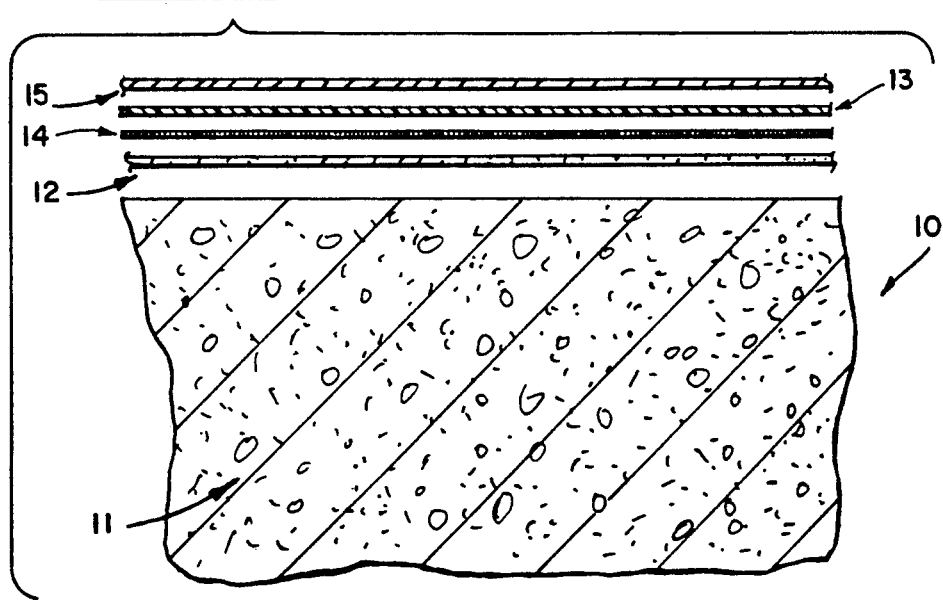
FIG_2

METHOD OF FORMING EMI SHIELDED ENCLOSURES, EMI SHIELDED ENCLOSURES AND EMI SHIELDS

This application is a continuation of application Ser. No. 07/504,007, filed Apr. 4, 1990, now abandoned.

BACKGROUND OF THE INVENTION

A. Field of the Invention

The present invention relates generally to electromagnetic interference (EMI) shielding techniques and more particularly to a method of forming EMI shielded enclosures, and an apparatus for shielding an enclosed volume by insulating the enclosed volume from interfering background electromagnetic waves and from the conductive effects of moisture.

B. Description of the Prior Art

EMI shielded enclosures are used for many purposes including minimizing the susceptibility of data processing equipment to external surveillance and for isolating sensitive equipment from interference due to ambient electromagnetic radiation and other outside activity. For example, in magnetic resonance imaging (MRI) applications, EMI must be minimized to prevent artifacts, or pictorial flaws in the final image. Also, the superconducting magnets, an integral part of MRI, must be isolated from outside magnetic influences such as automobile traffic, elevators, or other activities involving movement of large ferrous objects that can distort the homogeneity of the magnetic field. Ideal EMI shields should also incorporate a seamless construction, particularly in the floor, whereby mechanical seams, found in typical enclosures, are eliminated so as to minimize ground-level corrosion and enhance load bearing characteristics.

A commonly used type of shielded enclosure is a room totally enveloped or surrounded by a layer of electrically conductive material, such as a metal plate, a metal sheet or a metal screen. One example of an EMI shielded enclosure is disclosed in U.S. Pat. No. 4,806,703, issued Feb. 21, 1989.

One EMI shielding procedure involves securing plates of metal shielding material, such as steel, to the floor, walls and ceiling of an enclosure (or containment room), that houses the magnetic resonance imaging device. For example, U.S. Pat. No. 4,651,099, discloses first covering a concrete-slab floor with water-impermeable plastic sheeting, and then placing asbestos board over the plastic sheeting. Finally, steel plating is placed over the asbestos flooring. The steel plating then can be covered with a decorative tile or other type flooring. Another EMI shielding procedure is disclosed by U.S. Pat. No. 4,755,630, including adhesively securing a plastic sheeting to the floor, then installing multiple layers of plywood, layed perpendicular to each other, onto the plastic sheeting. The plastic sheeting acts as a moisture barrier between the floor and the plywood. Aluminum sheets then are secured, such as with screws, onto the plywood subflooring.

Such shielding techniques are costly and labor intensive in that they involve elaborate preparation prior to the attachment of the metallic sheeting. These techniques also allow EM interference to develop due to the oxidation which often occurs between the nails, screws or similar mechanical fasteners and the EM shielding material whereby the fastener is no longer firmly grounded to the shielding material but instead acts as an antenna to receive any EM interference. While known methods and devices reduce EM interference, a need exists for an improved EMI shielded enclosure capable of, for example, essentially eliminating surreptitious monitoring of data processing activities, eliminating secondary ground paths via the floor which interferes with the troubleshooting of equipment, and also minimizing or eliminating EM interference that occurs due to the electrically-conductive effects of moisture between the metallic RF shielding material and a support substrate. Further, by eliminating all electrical contact between the EMI shielded enclosure and electrically grounded conductive members of the supporting parent structure, a single point ground system will be achieved which eliminates multiple ground loops and the associated stray currents flowing in the shielded enclosure surfaces which deteriorate shielding effectiveness.

SUMMARY OF THE INVENTION

It is an object of the present invention to provide a method of forming an EMI shielded enclosure, an EMI shield, and a shielded enclosure that overcomes many of the disadvantages and reliability shortcomings of the prior art systems.

Other objects of the invention include providing an enclosed space, or volume, that effectively resists the ingress or egress of electromagnetic frequency waves; providing an EMI shielded enclosure effective to isolate activities within the enclosed volume, such as data processing, from activities occurring outside the enclosed volume; providing an EMI shielded enclosure exhibiting a mechanically seamless design so as to eliminate the inherent disadvantages associated with mechanical seam configurations; providing effective electrical isolation between the enclosure floor shield plane and the grounded concrete (or other conductive material) parent room floor so that a single point ground may be established to the shielded enclosure; providing shield-floor-to-parent-floor electrical isolation which does not significantly degrade with time or with the presence of normal amounts of floor moisture inherent in concrete; providing a new and improved method of forming EMI shielded enclosures; and providing EMI shielded enclosures and methods that are more effective and less expensive than methods and enclosures used in the past.

Briefly the above and other objects of the present invention are provided by a new and improved method of forming EMI shielded enclosures, an EMI shield and an EMI shielded enclosure.

In accordance with the present invention, the method of forming an EMI shielded enclosure involves first applying one or more layers of a sealer composition to a surface of the parent enclosure. Then the sealer composition layer or layers are allowed to substantially cure. Substantially drying or curing before the next step is key to achieving the highest values of ground isolation. Onto this cured sealer layer(s) is applied an adhesive composition. Finally, an electrically conductive material, such as metallic sheet, is adhesively secured to the sealer layer via the adhesive composition.

Alternatively, in accordance with the present invention, the method of forming an EMI shielded enclosure involves first applying one or more layers of a sealer composition to a surface of the parent enclosure. Then, the sealer composition layer or layers are allowed to substantially cure. Substantially curing before the next step is key to achieving the highest insulation values. Onto this cured sealer layer is applied an adhesive composition. A first surface of a bonded sheet of dielectric material is then placed onto the adhesive composition layer so as to be secured by the adhesive composition layer. Onto a second surface of the bonded sheet is applied an adhesive composition. Finally, an electrically conductive material, such as metallic sheet, is adhesively secured to the second surface of the bonded sheet via the adhesive composition.

A new and improved EMI shield in accordance with the invention comprises a sealed substrate material that resists penetration of moisture within the substrate material through the sealer and an electrically-conducting shielding material adhesively secured to the sealer overlying the sealed substrate material.

The EMI shield is provided by sealing a substrate surface with a sealer composition selected from the group consisting of an epoxy sealer, a urethane sealer, a silicone sealer, an acrylic sealer, and a combination thereof. The adhesive composition is also selected from the group consisting of epoxy, urethane, silicone, acrylic, and a combination thereof.

BRIEF DESCRIPTION OF THE DRAWINGS

The invention together with the above and other objects and advantages will be best understood from the following detailed description of the preferred embodiment of the invention shown in the accompanying drawings, wherein:

FIG. 1 is a fragmentary perspective view of part of an EMI shielded enclosure according to the present invention; and FIG. 2 is an enlarged, exploded, fragmentary, cross-sectional view of the layers of an alternative shielded enclosure.

DETAILED DESCRIPTION OF THE INVENTION

Having reference now to the drawings, and initially to FIG. 1, there is illustrated a fragment of an EMI shielded enclosure according to the invention designated generally by the reference numeral 10. The method of forming EMI shielded enclosures of the present invention can be used for the moisture sealing and insulating of the floor, walls and ceiling surfaces of an enclosed volume, such as data processing and medical diagnostic imaging rooms. The method is particularly useful for shielding of a surface such as a concrete floor, where moisture is more likely to occur, but can be used for floor, wall and ceiling surfaces of many types.

As shown in FIG. 2, the shielded enclosure 10 includes a surface or support substrate 11, a sealer composition 12 applied to the surface 11, an adhesive composition 14 disposed upon the sealer composition 12 and an electrically conductive material 15 overlying the sealer composition layer 12, and therefore, the surface 11, and adhesively secured by the adhesive composition 14. In the illustrated example, the support substrate 11 is a poured concrete floor. Other substrates, such as plasterboard or wood walls or ceilings, can be used.

Typically, the sealer composition 12 is formed of a binding material providing both high electrical resistance and an effective moisture barrier when cured. Any adhesive that does not adversely affect the sealer layer 12 can be used as the adhesive composition 14. The adhesive composition 14 includes chemical compounds selected from the group consisting of epoxy, urethane, silicone and acrylic resins, and combinations thereof. Electrically conductive material 15 is an RF shielding material, such as thin copper foil. A myriad of other metal types can also be used for the metallic floor shield 15, including 24 gauge galvanized steel or terne metal (which utilizes a tin-lead coating), among others. Sealer composition 12 is selected from the group consisting of epoxy, urethane, silicone and acrylic resins, and combinations thereof.

In carrying out the method of the invention, forming a continuous, almost pinhole-free sealer layer 12 applied to substrate surface 11 will produce the best electrical insulation properties. Sealer composition 12 covers an area of the support surface 11 slightly greater than the perimeter of the shield 15 required The sealer 12 is applied in a substantially uniform layer or layers with no gaps or streaks. If the support surface 11 is porous, a thin layer of sealer 12 may be applied first, to expel the air from the pores of the substrate. Then a second, thicker layer of sealer 12 is applied to form a more substantial total insulation layer 12, for a total thickness of between 1/16" and ⅛". This second sealer layer may be applied before the first sealer layer completely dries. The sealer 12 is allowed to cure for a predetermined time period of sufficient duration to allow the sealer 12 to substantially dry or cure, for example, such as 4 hours for a catalytically-cured, two part composition. It is important that the sealer 12 be allowed to dry or cure before applying adhesive 14 and attaching metallic shield 15. Otherwise, air and moisture that is being displaced out of the surface 11 will make fissure holes in the sealer layer 12 that can serve as electrical conduits between the surface 11 and the shield 15. Also a more continuous film surface 12 will best be formed by allowing the surface 12 to harden undisturbed. Further, the continuous surface of the cured sealer composition layer 12 prevents moisture from seeping to the metallic shield 15 from the surface 11.

Next, a layer of the adhesive composition 14 is applied over the sealer composition 12 and the electrically conductive material 15 is placed into intimate contact with the adhesive composition 14 before the adhesive cures. The adhesive composition is of the type that eliminates the need for penetrating fasteners.

Alternatively, the insulating layer having a total thickness of between 1/16" and ⅛" can be achieved by applying adhesive composition 14 to a single sealer layer 12, and then attaching the first side of a bonded sheet of dielectric material 13 (FIG. 2) to the adhesive composition 14. A suitable bonded dielectric sheet material is a relatively rigid polyvinyl chloride laminate or the like. Onto the second side of the bonded sheet of dielectric material 13 is applied another layer of adhesive composition similar to the first adhesive layer 14 and the electrically conductive material 15 is placed into intimate contact with the second layer of adhesive composition 14A before the adhesive cures.

The resulting EMI shielded enclosure 10 reduces the tendency of the floor seams to buckle, while they are being soldered or welded, resulting in a flatter floor. Any moisture in the surface 11 is separated from the metallic shield 15 by the sealer composition 12 which acts as an effective moisture barrier. This exclusion of moisture also improves the corrosion resistance of the metallic shield material 15. Also, the finished shielded enclosure 10 is electrically isolated from the parent building by the high electrical resistance or insulation properties of the sealer composition 12. Gluing down the metal shield 15 directly to the parent-room surface 11 (i.e., without the cured sealer intermediate layer 12)

in one step does not yield good high insulation resistance nor does it eliminate electrolytic action.

The use of a composition selected from the group consisting of epoxy, urethane, silicone and acrylic resins, and combinations thereof, for both the sealer composition layer 12 and the subsequent adhesive composition layer 14 provides an intimate bond with the surface 11 so that nails or other metallic fasteners penetrating through the shield 15 and into the parent surface 11 are not needed. Such fasteners are advantageously avoided because these devices would normally degrade the EMI shielding performance and adversely effect long term reliability due to galvanic and other corrosion.

The resultant intimate bond between the insulating sealer layer 12 and both the support substrate 11 and the electricaly conductive shield material 15 substantially reduces the opportunity for moisture to penetrate between the insulating sealer layer 12 and the metallic floor shield 15 over the useful life of the shielded enclosure. The result is an improvement of the lifetime isolation resistance and reduction of any electrolytic corrosion of the electrically conductive shield material 15.

Obviously, many modifications and variations of the present invention are possible in light of the above details and teachings. Thus, it is to be understood that these details are not intended to limit the scope of the invention as defined by the following claims.

What is claimed and desired to be secured by letters patent of the United States is:

1. A method of forming an EMI shielded load bearing floor for an EMI shielded enclosure comprising the steps of:
   applying a sealer composition to a rigid support substrate of said enclosure;
   allowing said sealer composition to substantially cure on said rigid support substrate so as to create a substantially uniform seamless surface;
   applying an adhesive composition to said sealed substrate; and
   bonding an electrically conductive sheet material to said uniform seamless surface with said adhesive composition.

2. A method as recited in claim 1 wherein said sealer composition is water-proof.

3. A method as recited in claim 1 wherein said electrically conductive material is metal.

4. A method as recited in claim 1 wherein said sealer composition includes chemical compounds selected from the group consisting of epoxy, urethane, silicone, and acrylic resins, and a combination thereof.

5. A method as recited in claim 1 wherein said adhesive composition includes chemical compounds selected from the group consisting of epoxy, urethane, silicone, and acrylic resins, and combinations thereof.

6. A method as recited in claim 1 wherein said sealing of the rigid support substrate consists of first applying a thin primer layer then a more substantial sealing layer.

7. A method of forming an EMI shielded load bearing floor for an EMI shielded enclosure comprising the steps of:
   applying a sealer composition to a rigid support substrate of said enclosure;
   allowing said sealer composition to substantially cure on said rigid support substrate so as to create a substantially uniform seamless surface;
   attaching a first side of a bonded sheet of dielectric material to said adhesive composition first layer;
   applying an adhesive composition second layer to second side of said bonded sheet of dielectric material; and
   bonding an electrically conductive sheet material to said second side of said bonded sheet of dielectric material with said adhesive composition second layer.

8. A method as recited in claim 7 wherein said sealer composition is water-proof.

9. A method as recited in claim 7 wherein said electrically conductive material is metal.

10. A method as recited in claim 7 wherein said sealer composition includes chemical compounds selected from the group consisting of epoxy, urethane, silicone, and acrylic resins, and a combination thereof.

11. A method as recited in claim 7 wherein said adhesive composition includes chemical compounds selected from the group consisting of epoxy, urethane, silicone, and acrylic resins, and combinations thereof.

* * * * *

UNITED STATES PATENT AND TRADEMARK OFFICE
CERTIFICATE OF CORRECTION

PATENT NO. : 5,286,318
DATED      : February 15, 1994
INVENTOR(S) : Sims et al.

It is certified that error appears in the above-identified patent and that said Letters Patent is hereby corrected as shown below:

At column 6, claim 7, after line 23, insert the following:

--applying an adhesive composition first layer to said sealed substrate;--.

Signed and Sealed this

Twenty-sixth Day of July, 1994

Attest:

BRUCE LEHMAN

Attesting Officer  Commissioner of Patents and Trademarks